US010997706B2

(12) United States Patent
Chen et al.

(10) Patent No.: US 10,997,706 B2
(45) Date of Patent: May 4, 2021

(54) RETICLE BACKSIDE INSPECTION METHOD

(71) Applicant: TAIWAN SEMICONDUCTOR MANUFACTURING CO., LTD., Hsinchu (TW)

(72) Inventors: Zi-Wen Chen, Taichung (TW); Po-Chung Cheng, Chiayi County (TW); Chih-Tsung Shih, Hsinchu (TW); Li-Jui Chen, Hsinchu (TW); Shih-Chang Shih, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/115,699

(22) Filed: Aug. 29, 2018

(65) Prior Publication Data

US 2019/0102875 A1    Apr. 4, 2019

Related U.S. Application Data

(60) Provisional application No. 62/566,126, filed on Sep. 29, 2017.

(51) Int. Cl.
| | | |
|---|---|---|
| *G06T 7/00* | (2017.01) |
| *H04N 5/00* | (2011.01) |
| *G06T 7/521* | (2017.01) |
| *G03F 7/20* | (2006.01) |
| *G03F 1/84* | (2012.01) |
| *H04N 5/232* | (2006.01) |

(52) U.S. Cl.
CPC ............. *G06T 7/0004* (2013.01); *G03F 1/84* (2013.01); *G03F 7/70591* (2013.01); *G06T 7/521* (2017.01); *G06T 2207/10148* (2013.01); *G06T 2207/20212* (2013.01); *G06T 2207/30148* (2013.01); *H04N 5/23299* (2018.08)

(58) Field of Classification Search
CPC .................. G06T 7/0004; G06T 7/521; G06T 2207/10148; G06T 2207/20212; G06T 2207/30148; G03F 1/84; G03F 7/70591; H04N 5/23299
See application file for complete search history.

(56) References Cited

U.S. PATENT DOCUMENTS 4,715,392 A * 12/1987 Abe ......................... G03F 1/82
                                                                          134/113
6,665,065 B1 * 12/2003 Phan ................. G01N 21/95692
                                                                          356/237.1

(Continued)

*Primary Examiner* — Zhihan Zhou
(74) *Attorney, Agent, or Firm* — McDermott Will & Emery LLP (57) ABSTRACT

A method of inspecting a reticle includes obtaining a first image of a surface of the reticle at a first height by scanning the reticle surface with a light source at the first height of the reticle surface relative to a reference surface height of the reticle surface and obtaining a second image of the reticle surface at a second height by scanning the reticle surface with the light source at the second height of the reticle surface relative to the reference surface height of the reticle surface. The second height is different from the first height. The first and the second images are then combined to obtain a surface profile image of the reticle.

20 Claims, 10 Drawing Sheets

(56) References Cited

U.S. PATENT DOCUMENTS

| | | | | |
|---|---|---|---|---|
| 2002/0017621 A1* | 2/2002 | Rotsch | ............... | G01Q 40/00 250/559.29 |
| 2010/0254591 A1* | 10/2010 | Scherubl | .......... | G01N 21/95607 382/144 |
| 2013/0308125 A1* | 11/2013 | Perlitz | ...................... | G03F 1/84 356/237.4 |
| 2014/0014138 A1* | 1/2014 | Spiegelman | ............. | B08B 3/04 134/31 |
| 2014/0165236 A1* | 6/2014 | Budach | .................... | G03F 1/22 850/9 |
| 2014/0206111 A1* | 7/2014 | Tanaka | ............... | H01L 21/0274 438/16 |
| 2018/0095358 A1* | 4/2018 | Seitz | ..................... | G03F 1/144 |
| 2018/0209916 A1* | 7/2018 | Terasawa | ................. | G03F 1/84 |

* cited by examiner

RETICLE BACKSIDE INSPECTION METHOD

RELATED APPLICATION

This application claims priority to U.S. provisional application No. 62/566,126, filed on Sep. 29, 2017, the entire contents of which are incorporated herein by reference.

TECHNICAL FIELD

The disclosure relates to a method and apparatus for lithography, particularly to inspecting a reticle used in the manufacture of semiconductor integrated circuits, and more particularly to a method of inspecting the backside of the reticle.

BACKGROUND

As the semiconductor industry has progressed into nanometer technology process nodes in pursuit of higher device density, higher performance, and lower costs, the wavelength of radiation used for photolithography has decreased from ultraviolet (UV) to deep ultraviolet (DUV) and, more recently to extreme ultraviolet (EUV). Further decreases in component size require further improvements in resolution of photolithography which are achievable using extreme ultraviolet lithography (EUVL). Because transmittance of most materials is substantially reduced at EUV wavelengths, EUVL uses reflective reticles rather than the traditional masks which use a patterned transparent plate for creating patterns in the photoresist layer.

Because patterns created by EUV lithography have a feature size in the range of several nanometers, maintaining the flatness of the reflective surface of the EUV reticle is important to prevent distortions in the pattern. These requirements have resulted in the development of apparatuses and methods for reticle inspection and detecting contaminants on the front and back of EUV reticles, which continue to evolve.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure generally relates to inspection of reticle (mask) used in lithography for manufacturing semiconductor devices. More particularly, embodiments of the present disclosure are related to methods and apparatuses for inspecting a backside of a reticle (mask) used for EUV lithography. Backside of the reticle refers to the side of the reticle opposite the side having the mask pattern. Because the feature size of patterns made by EUV lithography is in the range of several nanometers, even minute particulate contamination on the backside of the reticle can sufficiently distort the reflective face of the reticle to cause a distortion in the pattern of EUV reflected on the photoresist layer. Thus, maintaining the cleanliness and flatness of the backside of the reticle is as important as maintaining the cleanliness of the front (reflective) side of the reticle. In some embodiments of the present disclosure, the reticle backside is inspected via 3-dimensional (3D) images of the reticle backside without taking the reticle offline. Such in-line inspection can avoid delays caused by taking the reticle offline, which typically requires shutting the production and removing the reticle from the vacuum chamber. Further, such in-line inspection also avoids potentially exposing the reticle to other contamination while being inspected offline.

Figure 1A:
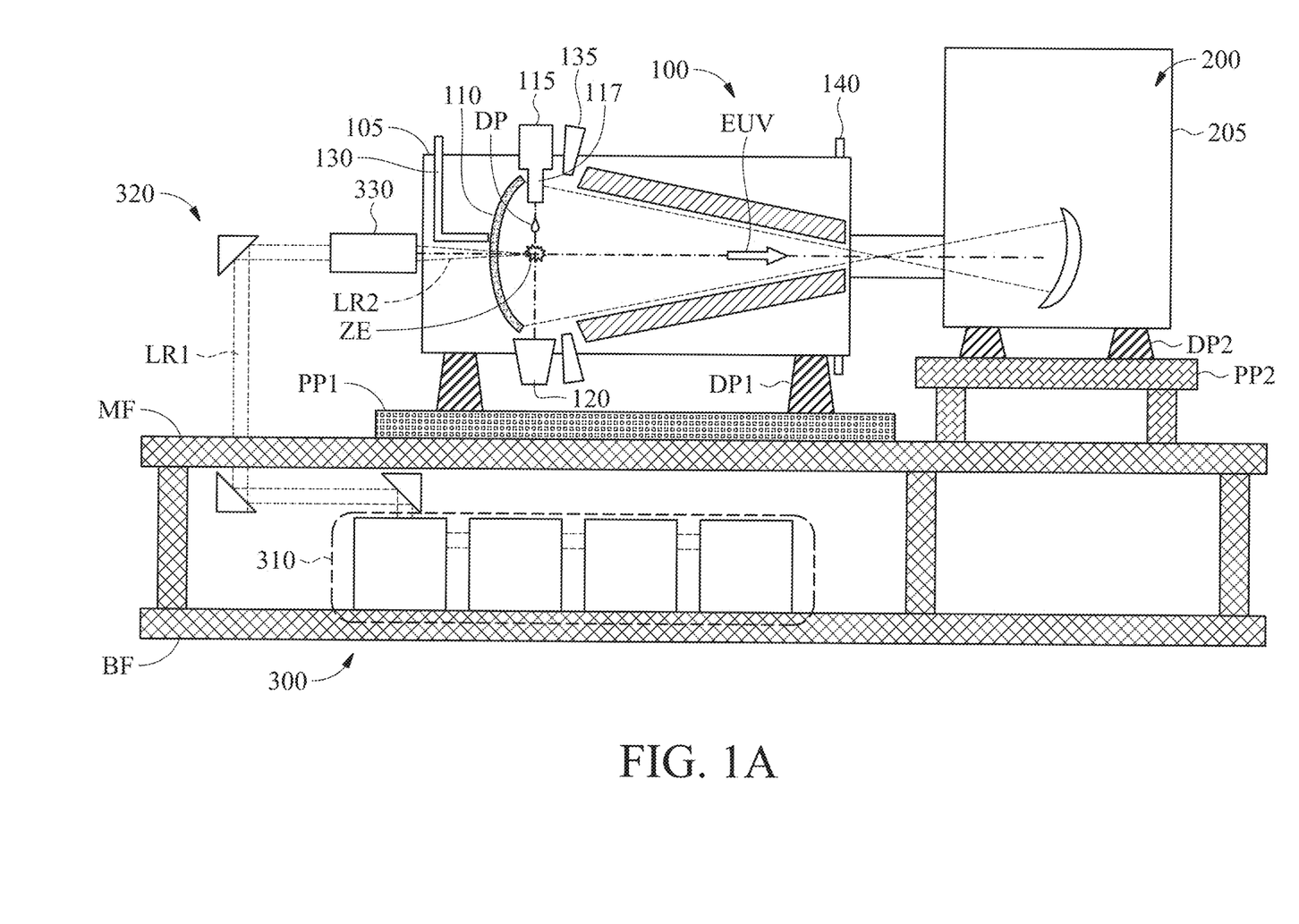
FIG. 1A is a schematic view of an EUV lithography system.

FIG. 1 is a schematic view of an EUV lithography system with a laser production plasma (LPP) based EUV radiation source, in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DP1 and DP2, respectively. The EUV radiation source 100 and the exposure tool 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength in a range from about 1 nm to about 100 nm. In one particular example, the EUV radiation source 100 generates an EUV light with a wavelength centered at about 13.5 nm.

The exposure tool 200 includes various reflective optical components, such as convex/concave/flat mirrors, a mask holding mechanism including a mask stage, and wafer holding mechanism. The exposure tool 200 further includes an exposure chamber 205 that encloses all of the optical components, mask holding mechanism and wafer holding mechanism of the exposure tool 200. The exposure chamber 205 provides a low-pressure of vacuum environment for the exposure tool 200 to avoid loss of intensity of the EUV radiation because of absorption from gases.

The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li.

The excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 µm or 10.6 µm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

Figure 1B:
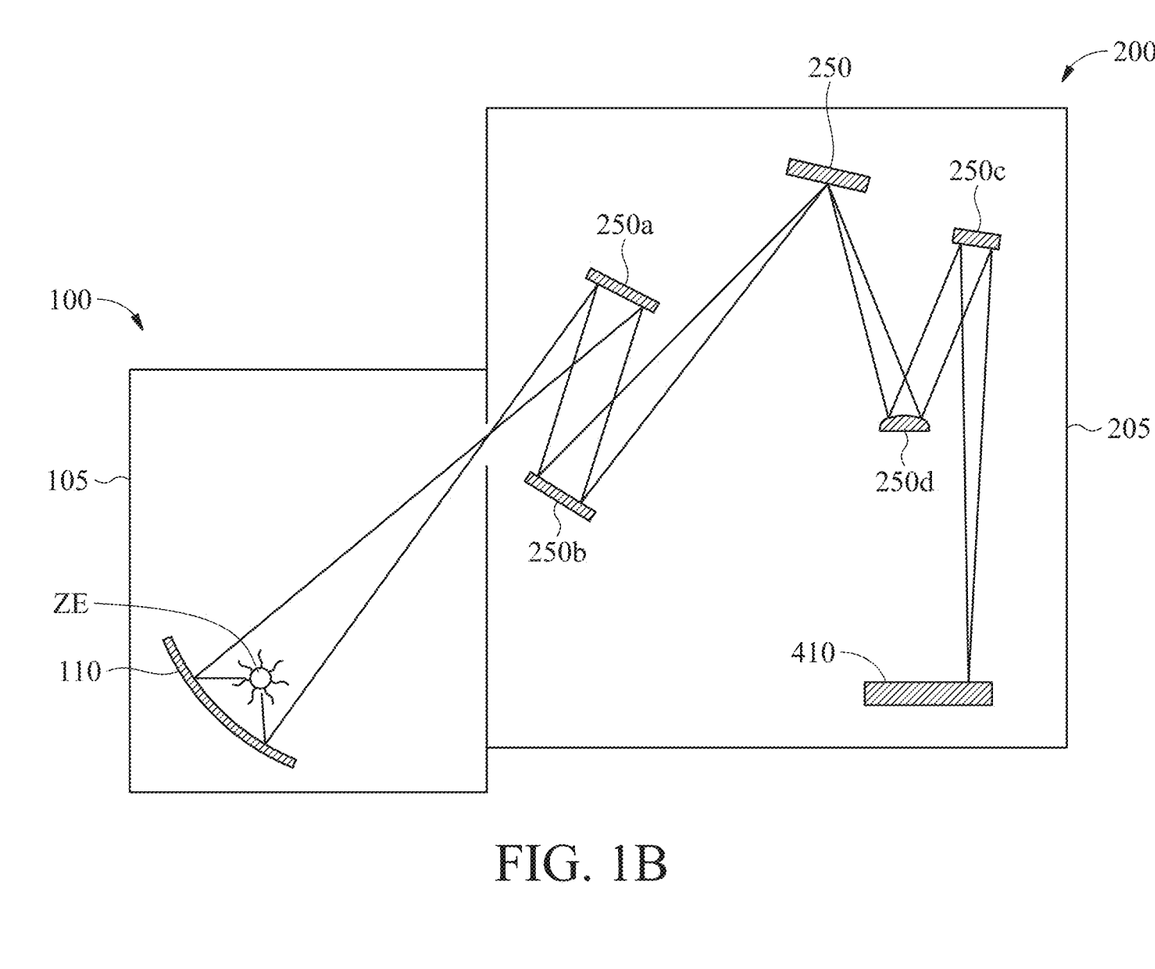
FIG. 1B is a simplified schematic diagram of a detail of an extreme ultraviolet lithography tool.

FIG. 1B is a simplified schematic diagram of a detail of an extreme ultraviolet lithography tool according to an embodiment of the disclosure showing the exposure of photoresist coated substrate 410 with a patterned beam of EUV light. The exposure device 200 is an integrated circuit lithography tool such as a stepper, scanner, step and scan system, direct write system, device using a contact and/or proximity mask, etc., provided with one or more optics 250a, 250b, for example, to illuminate a patterning optic 250, such as a reticle, with a beam of EUV light, to produce a patterned beam, and one or more reduction projection optics 250c, 250d, for projecting the patterned beam onto the substrate 410. A mechanical assembly (not shown) may be provided for generating a controlled relative movement between the substrate 410 and patterning optic 250. As further shown in FIG. 1B, the EUVL tool includes an EUV light source 100 including an EUV light radiator ZE emitting EUV light in a chamber 105 that is reflected by a collector 110 along a path into the exposure device 200 to irradiate the substrate 410.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s), such as at the EUV output light wavelength, the irradiation laser wavelength, a wavelength suitable for metrology or any other specific wavelength.

Figure 2:
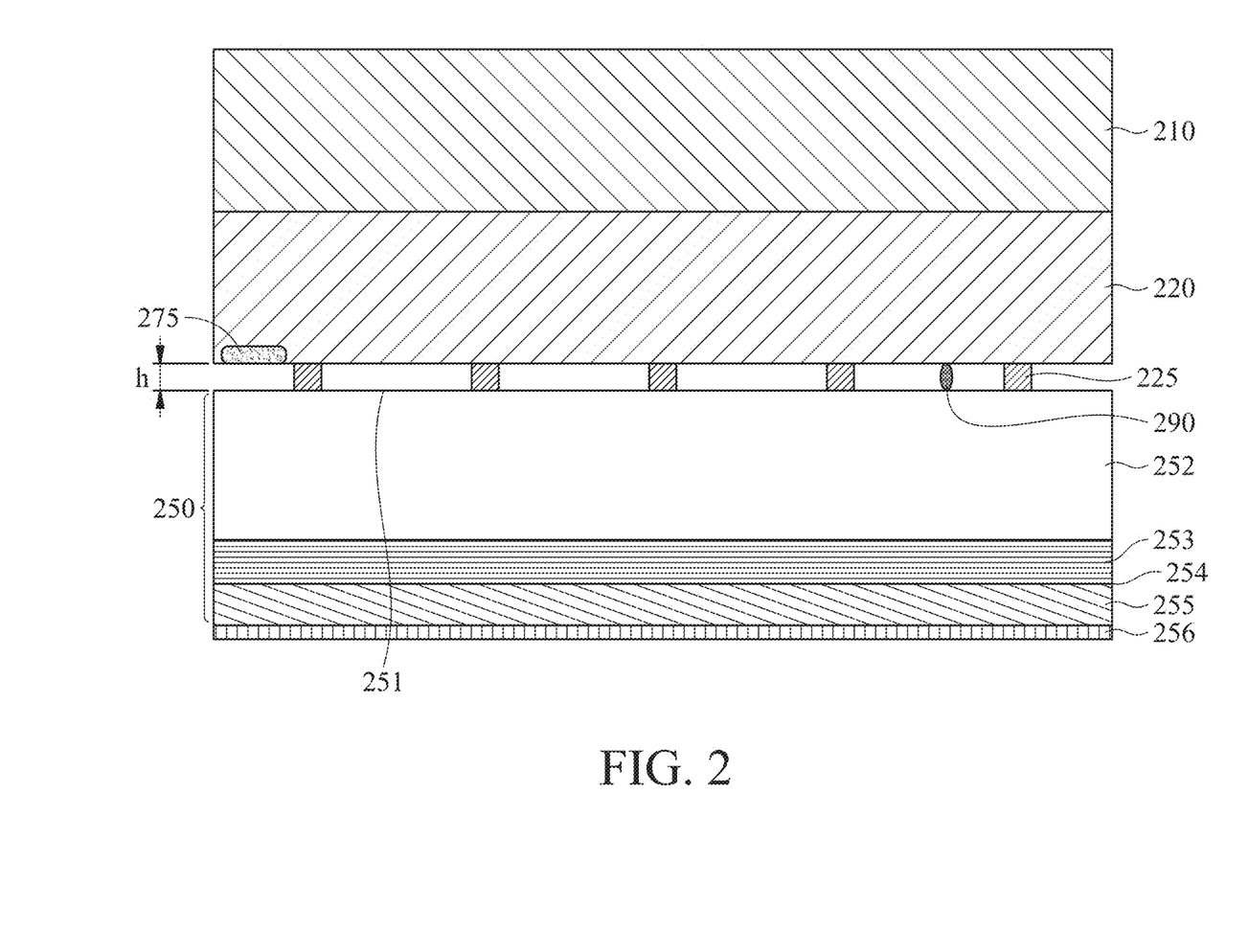
FIG. 2 schematically illustrates a mask holding mechanism relating to an embodiment of the present disclosure.

FIG. 2 schematically illustrates a mask holding mechanism in accordance with an embodiment of the present disclosure. The following description refers to FIG. 1B and FIG. 2. The EUV radiation EUV generated by the EUV radiation source 100 is guided by the reflective optical components onto a mask 250 secured on the mask stage 210. In some embodiments, the mask stage 210 includes an electrostatic reticle holder 220 (interchangeably referred to herein as an electrostatic chuck or e-chuck) to secure the mask 250.

In the present disclosure, the terms mask, photomask, and reticle are used interchangeably. In the present embodiments, the reticle 250 is a reflective mask. In an embodiment, the reticle 250 includes a substrate 252 formed of a suitable material, such as a low thermal expansion material or fused quartz. In various examples, the material includes $TiO_2$ doped $SiO_2$, or other suitable materials with low thermal expansion. The mask 250 includes multiple reflective multiple layers (ML) 253 deposited on the substrate 252. The ML 253 includes a plurality of film pairs, such as molybdenum-silicon (Mo/Si) film pairs (e.g., a layer of molybdenum above or below a layer of silicon in each film pair). Alternatively, the ML 253 may include molybdenum-beryllium (Mo/Be) film pairs, or other suitable materials that are configurable to highly reflect the EUV light. The mask 250 may further include a capping layer 254, such as ruthenium (Ru), disposed on the ML for protection. The mask 250 further includes an absorption layer 255, such as a tantalum boron nitride (TaBN) layer, deposited over the ML. The absorption layer 255 is patterned to define a layer of an integrated circuit (IC). Alternatively, another reflective layer 256 may be deposited over the ML and is patterned to define a layer of an integrated circuit, thereby forming an EUV phase shift mask.

The reticle 250 and electrostatic chuck 220 of FIG. 2 are positioned such that EUV radiation supplied from the EUV radiation source 100 is in focus when it arrives at the surface of the semiconductor workpiece.

In the present embodiments, the reticle 250 is secured by the electrostatic chuck 220 by an electrostatic potential. The reticle 250 abuts burls 225, which reside on a surface of the electrostatic chuck 220, and have a width (w) in a range from about 100 µm to about 500 µm, are spaced apart in a range from about 1.0 mm to about 5.0 mm, and a height from the bottom surface of the reticle 220 in a range from about 1.0 µm to about 100 µm. Some industry-standard electrostatic chucks utilize greater than 2,000 of such burls comprising roughly 1.4% of the surface area of the electrostatic chuck 220, to support the reticle 250.

Figure 3A:
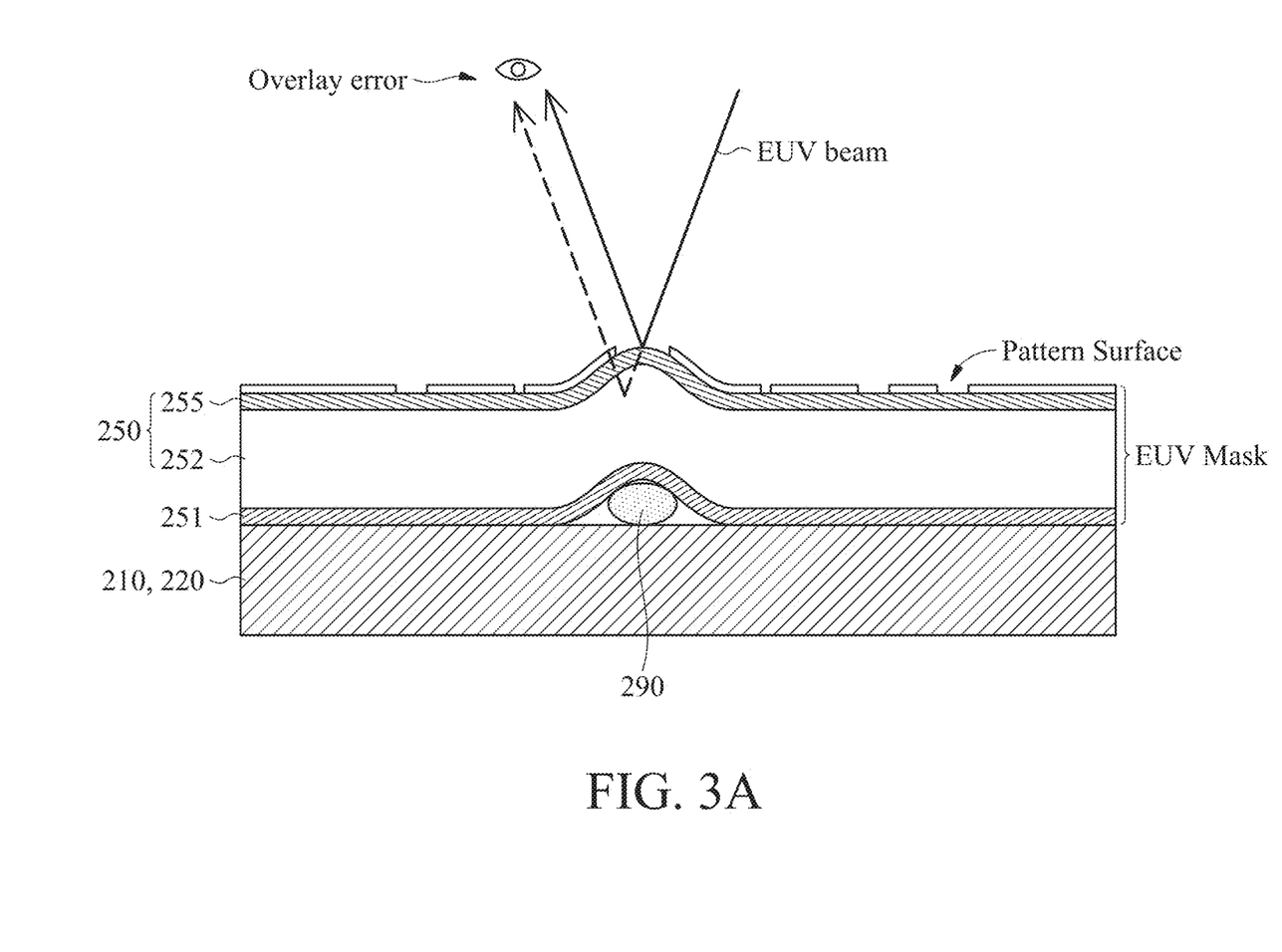
FIG. 3A illustrates distorted topography of a reticle resulting from contaminants and other factors.

Electrostatic chucking can secure and release the reticles in times of less than 1 second with an equal or greater force than conventional vacuum chucks. In addition to overlay error due to reticle 250 misalignment, as shown in FIG. 3A, distorted topography between the reticle 250 and the electrostatic chuck 220 can result in overlay error. Distorted topography can result from burl wear or contaminants 290 between a surface of the electrostatic chuck 220 and the back surface 251 of reticle 250. For instance, burl wear is observed on one of the burls, where corners have rounded due to repeated use, which can result in non-planar clamping. Additionally, if another burl has a flattened contaminant 290 (e.g., gold, etc.) on its top surface, reticle topography is further distorted. And while small contaminants 290 (e.g., with a diameter less than h) resting on portions between burls may not impact reticle topography, larger contaminants 290 (e.g., with a diameter greater than h) will impact reticle topography.

In various cases, the contaminant 290 is a metal particle, a resist particle or a particle of any material generally used in semiconductor manufacturing process such as, for example, silicon dioxide, silicon nitride, etc.

Figure 3B:
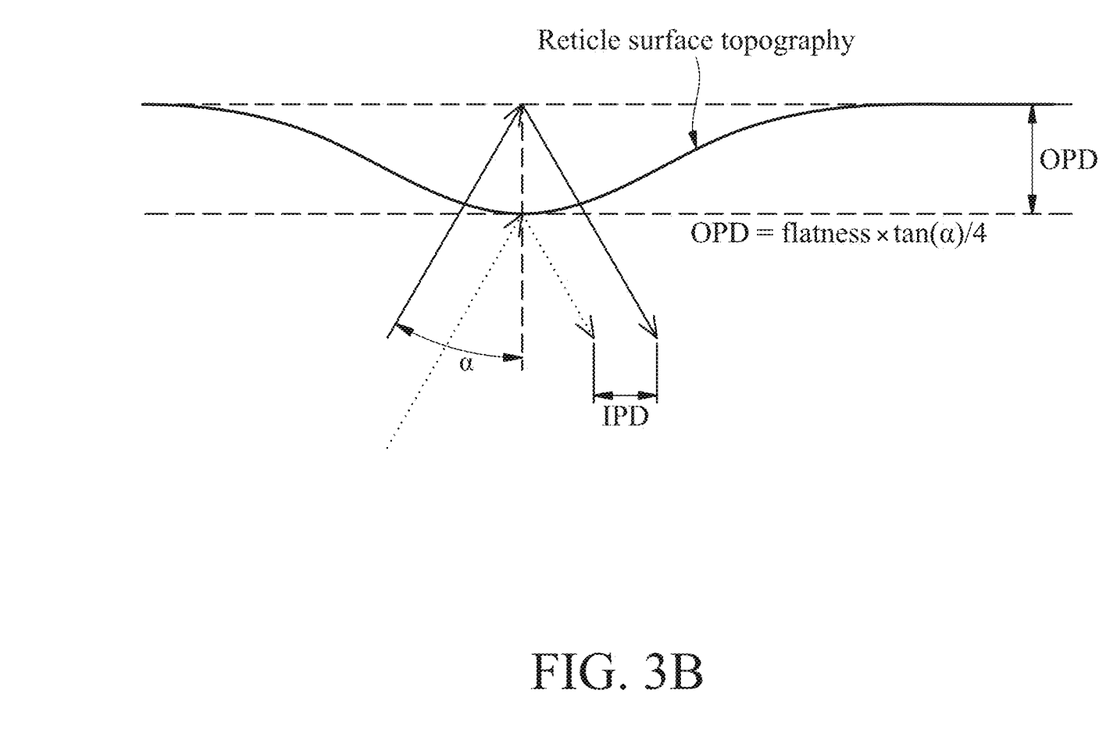
FIG. 3B illustrates the effect of distorted topography of a reticle resulting from contaminants and other factors.

FIG. 3B further illustrates the effect of distorted topography of the reticle 250 resulting from the contaminants and other factors, which causes an out of plane distortion (OPD) of the reticle surface, resulting in a lateral displacement or in plane distortion (IPD) of the radiation reflected by the reticle. For example, if a particulate contaminant 290 having a diameter larger than the burl height h is adhered to the back surface 251 of the reticle 250 between neighboring burls, the contaminant 290 pushes against the back surface 251 of the reticle 250 when the reticle 250 is secured to the reticle holder 220. Depending on material properties (e.g., elasticity, malleability, etc.) of the reticle 250 and the material properties of the contaminant 290, the distortion in the back surface of the reticle 250 may be transmitted to the front (i.e., reflecting) surface 255 of the reticle 250. Such distortion in local topology of the reflecting surface of the reticle 250 is illustrated in FIG. 3B and is represented by the OPD. While such OPD may not significantly affect the focus of the EUV radiation at the wafer surface 410, the OPD shifts the optical path of the EUV radiation incident on the curved portion—resulting in IPD. For example, for a pattern with an absorption region laterally adjacent to a reflecting region on the front surface 255 of reticle 250, IPD may cause EUV radiation that is supposed to be reflected to get absorbed, and EUV radiation that is supposed to get absorbed to be reflected. In other words, IPD results in loss of pattern fidelity. In other instances, IPD may additionally result in loss of overlay control for the reticle 250 and degradation in pattern uniformity such as critical dimension (CD) variation, shape biasing, etc.

It is, therefore, desirable to ensure that the back surface 251 of the reticle 250 is contaminant free in some embodiments. Periodic inspection of the back surface 251 of the reticle 250 is generally performed to scan the back surface 251 and obtain a 2D map of the reticle back surface 251 to monitor the amount and size of contaminants on the back surface 251.

Figure 4A:
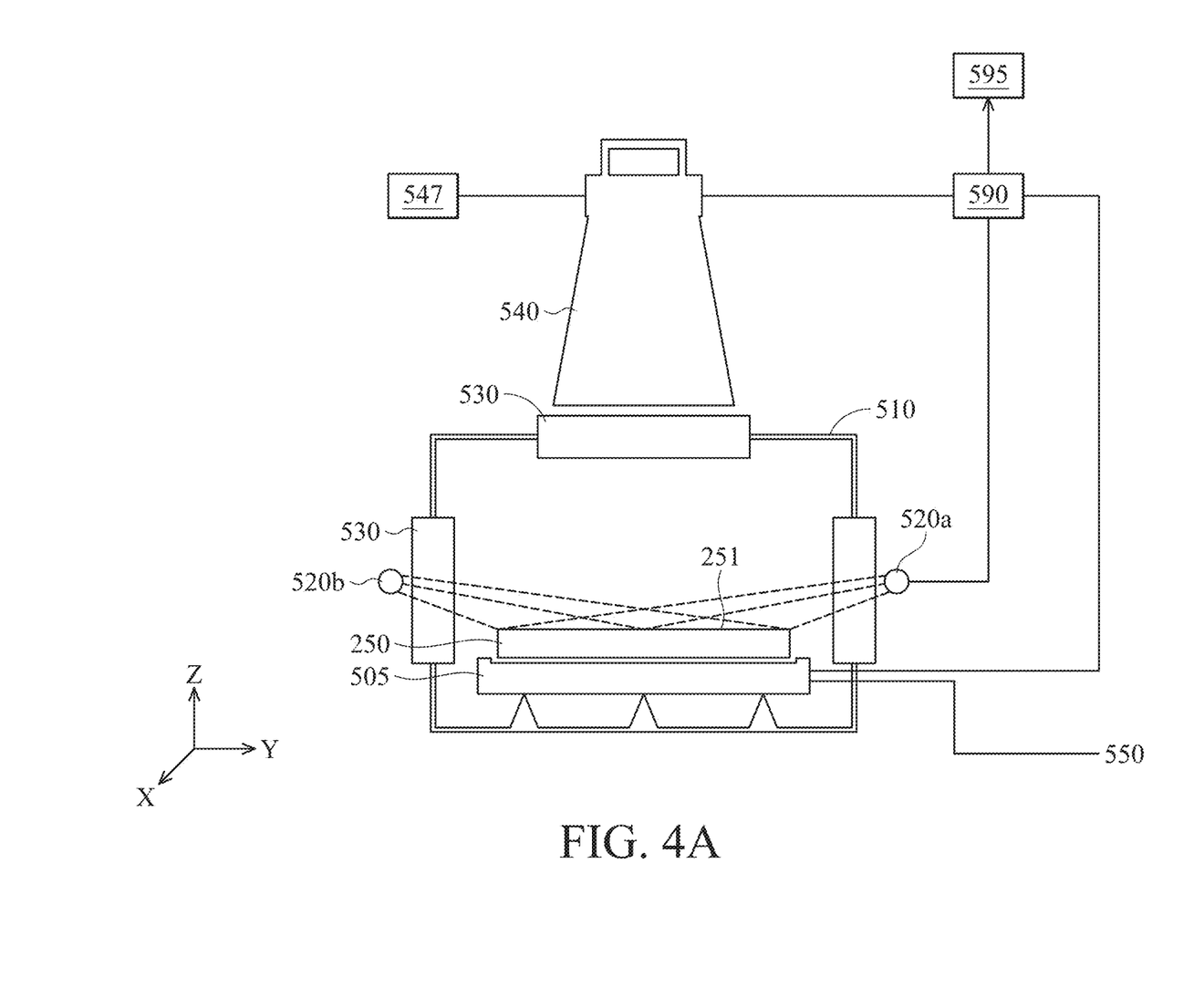
FIG. 4A schematically illustrates an apparatus for inspecting a backside of a reticle in accordance with an embodiment of the present disclosure.

FIG. 4A illustrates an apparatus for inspecting a backside of a reticle in accordance with an embodiment of the present disclosure. In an embodiment, the apparatus includes a vacuum housing 510 having transparent windows 530. The vacuum housing 510 includes a stage 505 on which the reticle 250 rests while being inspected. Illuminators 520a and 520b illuminate the backside 251 of the reticle 250 through windows 530. In other words, FIG. 4A shows the reticle 250 is placed facing down such that the pattern surface 255 faces the stage 505. An imaging device 540 detects the light scattered and/or reflected from the backside 251 of the reticle 250. A scanner 550 moves the stage 505 in a direction perpendicular to the surface 251 of the reticle 250. A focus controller 547 moves the focal plane of the imaging device 540 in the direction perpendicular to the surface 251 of the reticle 250. An image acquisition controller 590 controls the illuminators 520a and 520b, the imaging device 540 and the scanner 550 to obtain images of the backside surface 251 of the reticle 250 at a plurality of different heights. In an embodiment, the image acquisition controller 590 additionally includes an image processor programmed to combine the acquired images to obtain a 3-dimensional surface profile map of the backside surface 251 of the reticle 250. In some embodiments, the image processor is additionally programmed to analyze the surface profile map to determine whether the reticle 250 is acceptable for lithography process.

The vacuum housing 510 is sized to hold the stage 505 on which the reticle 250 rests, and is made of a suitable material such as, for example, metals like stainless steel or aluminum in some embodiments. For convenience of reference, the plane defined by the backside 251 of the reticle 250 defines the X and Y directions as illustrated in FIG. 4A. The direction perpendicular to the surface 251 of the reticle 250 is the Z direction. In FIG. 4A, the positive Z direction is upwards extending from the reticle 250 to the imaging device 540.

In an embodiment, the stage 505 can be moved in X, Y and/or Z directions using the scanner 550. In some embodiments, the scanner 550 includes one or more actuators that can move the stage 505 in a prescribed direction by a prescribed distance. In some embodiments, the actuators include stepper motors, piezoelectric actuators or a combination of stepper motors and piezoelectric actuators. In some embodiments, the scanner 550 additionally includes a controller to control the one or more stepper motors and/or piezo actuators such that a desired movement of the stage 505 can be achieved with precision at a prescribed time, or repeat the movement of the stage 505 over a prescribed period of time. In various embodiments, the scanner 550 moves the stage 505 in one or more of X, Y and Z directions. For example, in an embodiment, the scanner 550 moves the stage 505 only in Z direction (i.e., up and down).

Figure 4B:
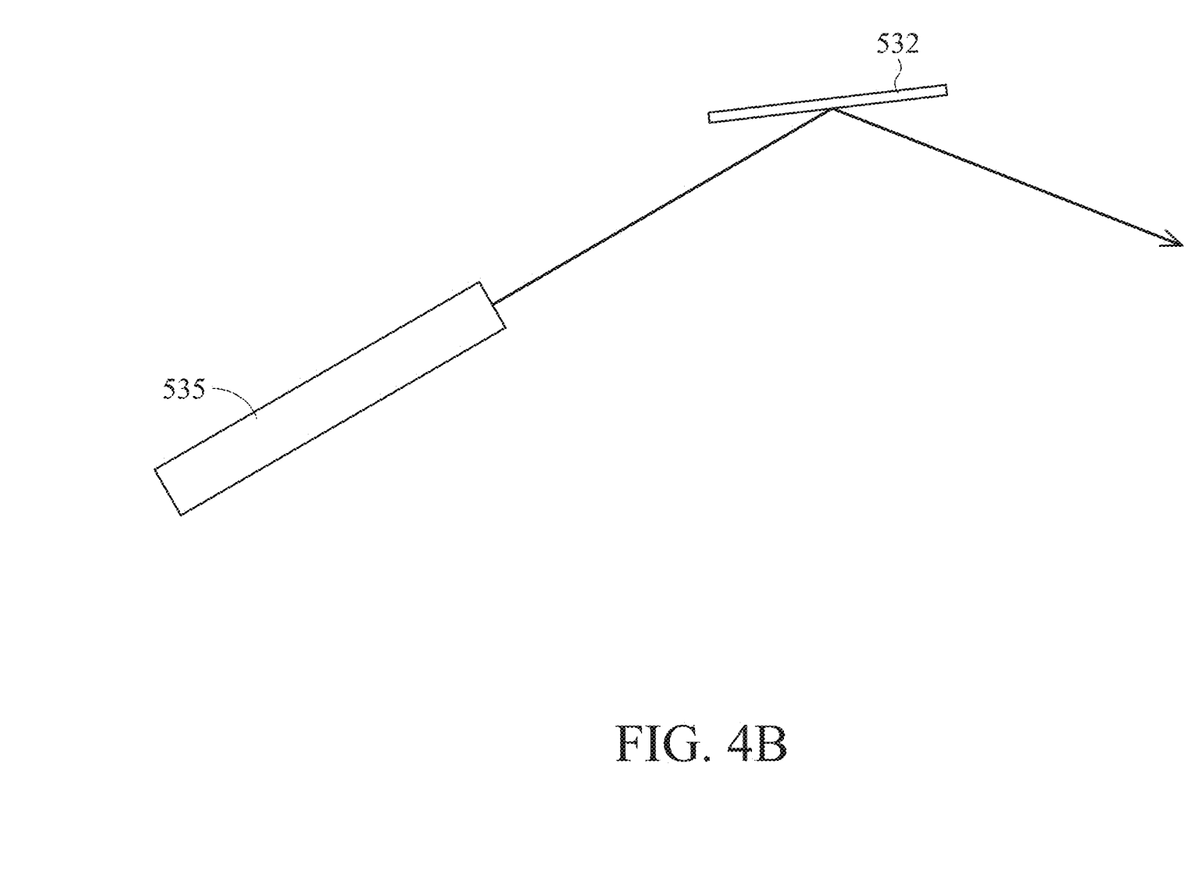
FIG. 4B schematically illustrates an illuminator for the apparatus for inspecting a backside of a reticle in accordance with an embodiment of the present disclosure.

FIG. 4B illustrates an example of an illuminator for the apparatus for inspecting a backside of a reticle in accordance with an embodiment of the present disclosure. The illuminators 520a and 520b are lasers 535 in some embodiments. In an embodiment, the illuminators 520a and 520b have a wavelength in the visible region of electromagnetic spectrum. In other embodiments, the illuminators 520a and 520b have wavelengths in the infrared region or ultraviolet region.

In some embodiments, the illuminators 520a and 520b each are provided with a suitable mechanism to move the light radiated by the respective illuminator to scan the backside surface 251 of the reticle 250. For example, in an embodiment, the illuminators 520a and 520b are coupled to actuators that change the angle of the light beam radiated by the respective illuminator with respect to the backside surface 251 of the reticle 250. One example of such an actuator is a steerable mirror 532 placed at a suitable position. Another example of such an actuator is a stepper motor (not shown) attached to one end of the respective illuminator. In an embodiment, the light from the illuminators 520a and 520b scan the backside surface 251 of the reticle 250 in different directions, e.g., perpendicular to each other. For example, in an embodiment, the light from illuminator 520a scans the backside surface 251 of the reticle 250 in the X direction and the light from the illuminator 520b scans the backside surface of the reticle 250 in Y direction. In various embodiments, the light beams from respective illuminators are rastered in respective directions to scan the backside surface of the reticle 250. Other paths of scanning are also contemplated within the scope of the present disclosure. In embodiments where the illuminators 520a and 520b scan the backside 251 of the reticle 250 simultaneously, the illuminators 520a and 520b have different parameters for the light beam to avoid interference from the two sources. For example, in an embodiment, the illuminators 520a and 520b emit light at different wavelengths.

In an embodiment, the illuminators 520a and 520b produce a planar "curtain" of light extending in a particular direction, e.g., the light curtain from the illuminator 520a extends in Y direction and the light curtain from the illuminator 520b extends in X direction. The "curtain" of light is achieved, in some embodiments, by using line sources for illuminators 520a and 520b. In other embodiments, each of the illuminators 520a and 520b are provided with a slit through which the light emitted by the illuminators 520a and 520b passes to form the "curtain" of light. In such an embodiment, the illuminators 520a and 520b are moved such that the light curtain from the illuminator 520a traverses in X direction and the light curtain from the illuminator 520b traverses in Y direction, to scan substantially the entire backside surface 251 of the reticle 250.

The windows 530 are positioned to allow light from the illuminators 520a and 520b to pass through to be incident on the backside 251 of the reticle 250 and also to allow light scattered/reflected from the backside 251 of the reticle 250 to be received at the imaging device 540. The windows 530 are made of a material that is transparent to the wavelength of the illuminators 520a and 520b, and sufficiently mechanically strong to withstand the vacuum in the vacuum housing 510. The windows 530 are made of fused quartz in some embodiments. In other embodiments, the windows 530 are made of glass or sapphire.

Figure 4C:
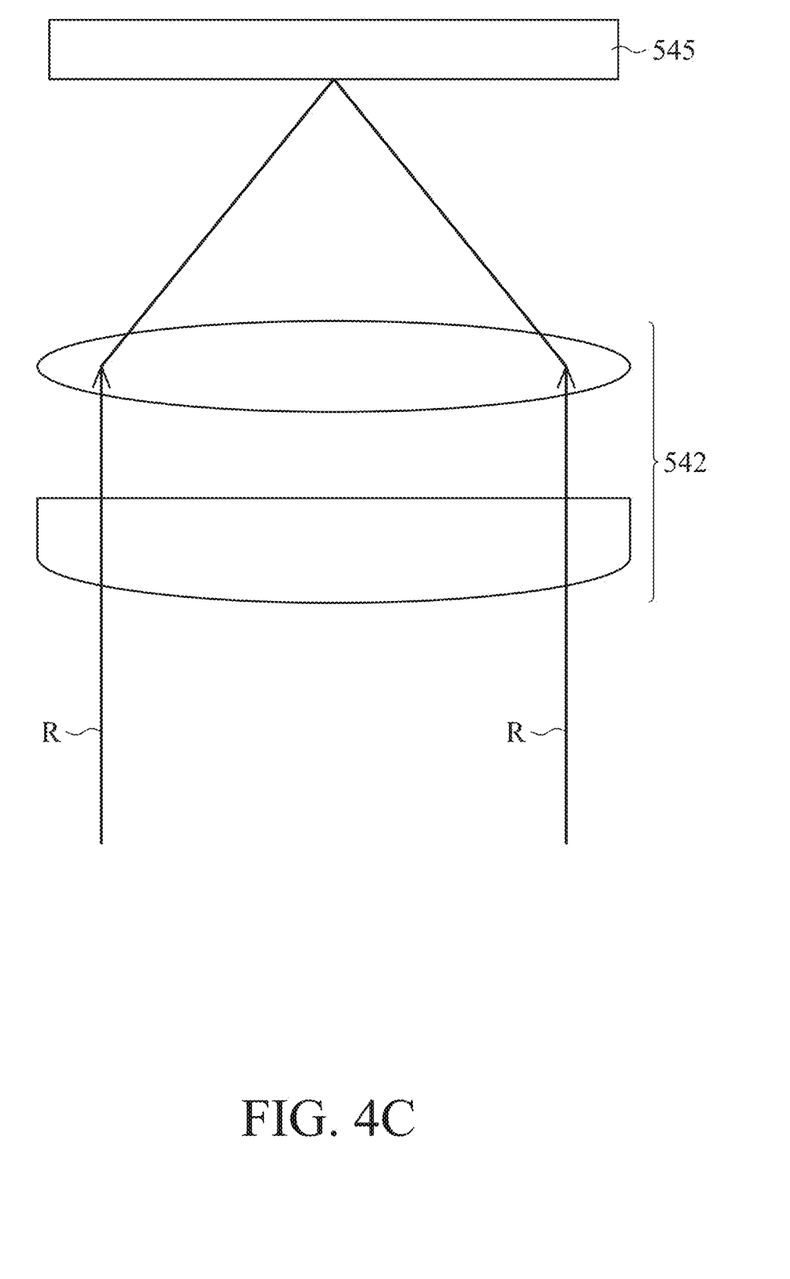
FIG. 4C schematically illustrates an imaging device for the apparatus for inspecting a backside of a reticle in accordance with an embodiment of the present disclosure.

FIG. 4C schematically illustrates an example of an imaging device for the apparatus for inspecting a backside 25 of a reticle in accordance with an embodiment of the present disclosure. The imaging device 540 is positioned to detect light scattered and/or reflected from the backside 251 of the reticle 250 as it is illuminated by the light from illuminators 520a and 520b. In an embodiment, as shown in FIG. 4A, the imaging device 540 is placed outside the vacuum housing 510 and the light scattered and/or reflected from the backside 251 of the reticle 250 reaches the imaging device 540 through one of the windows 530. However, the placement of the imaging device 540 is not restricted in this manner for the purposes of the present disclosure. For example, in an embodiment, the imaging device 540 is placed inside the vacuum housing 510 at a suitable position (not shown in the figures) to detect the light R scattered and/or reflected from the backside 251 of the reticle 250. In an embodiment, the imaging device 540 includes a camera 545 such as, e.g., a charge-coupled device (CCD). In an embodiment, the imaging device 540 further includes one or more lenses and/or prisms 542 configured to focus the light scattered R and/or reflected from the backside of the reticle 250 at the imaging plane of the imaging device 540. In such an embodiment, the lenses and/or prisms 542 as well as the imaging device 540 are arranged in a suitable housing (not shown).

In an embodiment, using the imaging acquisition controller 590, the light from the illuminators 520a and 520b is scanned across the backside surface 251 of the reticle 250 while keeping the stage 505 at a given height. The light scattered and/or reflected from the backside surface 251 of the reticle 250 is detected by the imaging device 540 to render a two dimensional (2-D) map of the backside surface 251 of the reticle 250. The image acquisition controller 590 then causes this process to be repeated by moving the stage 505 in Z direction to positions at different heights, e.g., via the scanner 550, producing a plurality of 2-D maps of the backside surface 251 of the reticle 250.

In another embodiment, using the image acquisition controller 590, the stage 505 is kept at a fixed position, and the light from the illuminators 520a and 520b is repeatedly scanned across the backside surface 251 of the reticle 250 while changing the plane of focus of the imaging device 540 using, for example, the focus controller 547. The focus controller 547, in some embodiments, includes a stepper motor to move the lens assembly 542 (or individual components within the lens assembly) in the Z direction. In other embodiments, lenses and/or prisms are adjustable (i.e., can have variable foci) and the focus controller 547 modulates the focus (or foci) of the lenses and/or prisms. By this process, a plurality of 2-D maps of the backside surface 251 of the reticle 250 is produced at various planes including and above the backside surface 251 of the reticle 250.

The plurality of 2-D maps is then processed using the image acquisition controller 590 to compile a three dimensional (3-D) map of the backside surface 251 of the reticle 250. Such a 3-D map provides detailed information about the position, size and shape of particulate contaminants resting on the backside surface 251 of the reticle 250. This information is used to determine whether the reticle 250 can be used as is in further lithography processes, needs a repair or needs to be discarded.

In some embodiments, the image acquisition controller 590 provides the surface profile of the backside surface 251 of the reticle 250 to a surface profile analyzer 595 to analyze the surface profile of the backside surface 251 of the reticle 250 and determine whether the reticle is to be accepted as is, rejected or repaired before further use. The determination of whether the reticle is to be accepted, rejected or repaired is made based on values of one or more parameters of the backside surface 251 of the reticle 250. In various embodiments, the parameters include, without limitation, average roughness of the backside surface 251 of the reticle 250, number of particles on the backside surface 251, average size of the particles on the backside surface 251, size of the largest particle on the backside surface 251, area density of particles on the backside surface 251, etc.

In various embodiments, the image acquisition controller 590 and the surface profile analyzer 595 include one or more processors configured to variously perform processes for acquiring images of the backside surface 251, constructing a 3D map of the backside surface 251 based on the acquired images, and determine, based on the 3D map of the backside surface 251, whether the reticle 250 is to be accepted, rejected or repaired. In some embodiments, the image acquisition controller 590 and the surface profile analyzer 595 are implemented using a single processor. In other embodiments, each of the image acquisition controller 590 and the surface profile analyzer 595 are implemented using more than one processor. Other configurations are also contemplated.

Figure 5:
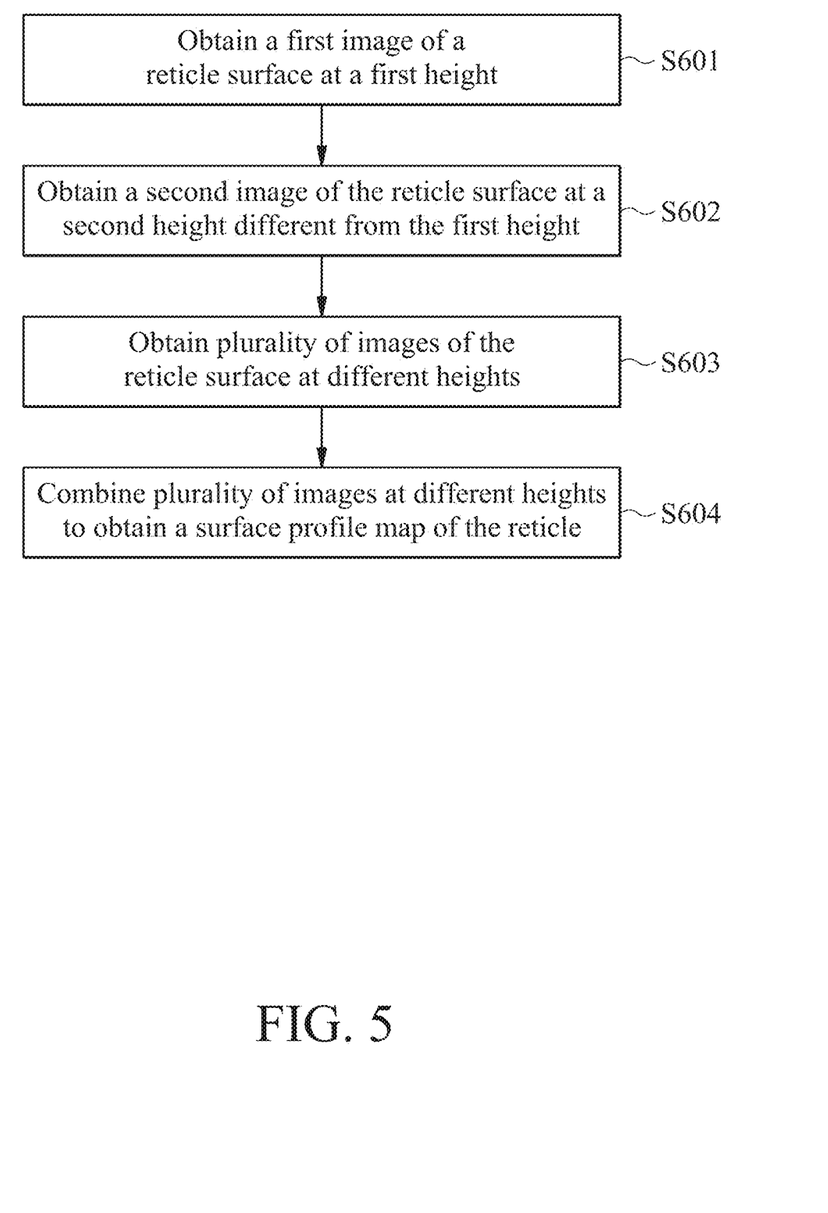
FIG. 5 is a flowchart illustrating a method of inspecting a reticle in accordance with embodiments of the present disclosure.
Figure 6:
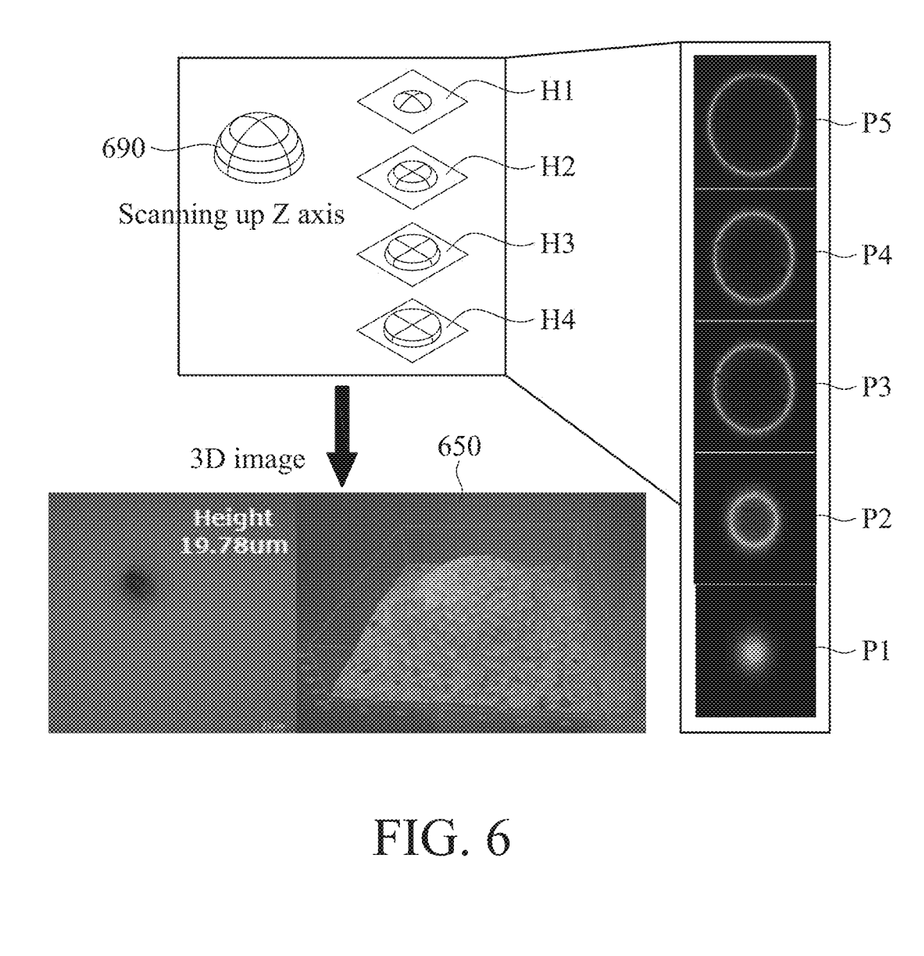
FIG. 6 schematically illustrates the process of obtaining a surface profile map of the reticle surface.

FIG. 5 is a flowchart illustrating a method of inspecting a reticle in accordance with embodiments of the present disclosure. FIG. 6 schematically illustrates the process of obtaining a surface profile map of the reticle surface. The method of inspecting the reticle will be described in reference to FIGS. 5 and 6.

In an embodiment, the method includes, at S601, obtaining a first image, e.g., P1, of a reticle surface at a first height by scanning the surface of the reticle with a light source at the first height, e.g., H1, of the reticle surface relative to a reference surface height of the reticle surface. The reference surface height, in an embodiment, corresponds to the backside surface of the reticle.

In various embodiments, the light source includes one or more illuminators such as, for example, lasers, to illuminate the surface of the reticle. In an embodiment, the one or more illuminators have a wavelength in the visible region of electromagnetic spectrum. In other embodiments, the one or more illuminators have wavelengths in the infrared region or ultraviolet region.

In some embodiments, the one or more illuminators are each provided with a suitable mechanism to move the light radiated by the respective illuminator to scan the backside surface of the reticle. For example, in an embodiment, the one or more illuminators are coupled to actuators that change the angle of the light beam radiated by the respective illuminator with respect to the backside surface of the reticle. One example of such an actuator is a mirror placed at a suitable position. Another example of such an actuator is a stepper motor attached to one end of the respective illuminator.

In some embodiments, the one or more illuminators provide a beam of light that creates a point-spot on the surface of the reticle. In such embodiments, the illuminators are moved (or the light from the illuminators is directed) such that the point-spot is rastered across the surface of the reticle. In other embodiments, the one or more illuminators provide a light beam that creates a line across the surface of the reticle. In one such embodiment, two illuminators create orthogonal lines across the surface of the reticle, and the two illuminators are moved (or the light from the two illuminators is directed) such that the line traverses the surface of the reticle in a direction perpendicular to the line. For example, if one of the illuminators creates a line along the X direction, the line is moved along the Y direction to cover substantially the entire surface of the reticle.

Any particulate contaminant, e.g., 690, resting on the surface of the reticle reflects and/or scatters the light from the illuminators, and is registered in the image, e.g., P1 detected by an imaging device. The imaging device includes a camera and a set of lenses and/or prisms in an embodiment. The camera, in some embodiments, is a charge-coupled device (CCD) camera. In some embodiments, the set of lenses and/or prisms is configured to create a plane of focus, at which the camera is focused, at the surface of the reticle in an embodiment. In some embodiments, the set of lenses and/or prisms can be moved to change the plane of focus of the imaging device in a direction perpendicular to the surface of the reticle. In some embodiments, the plane of focus is fixed, and a movable stage on which the reticle rests is provided to move the reticle in a direction perpendicular to the surface of the reticle.

At S602, a second image, e.g., P2, of the reticle surface at a second height, e.g., H2, is obtained by scanning the surface of the reticle at a second height of the reticle surface relative to the reference surface height of the reticle surface. The second height H2 is different from the first height H1. In an embodiment, the second height H2 is achieved by moving the reticle in a direction perpendicular to the surface of the reticle, e.g., in the Z direction. In another embodiment, the second height H2 is achieved by moving the plane of focus of the camera.

At S603, a plurality of images, e.g., P1, P2, P3, P4, etc., is obtained by repeatedly scanning of the surface of the reticle a plurality of times at a plurality of different heights, e.g., H1, H2, H3, H4, etc. As discussed elsewhere herein, the different heights can either be achieved by changing the plane of focus of the camera or by moving the reticle in a direction perpendicular to the surface of the reticle. In various embodiments, the distance between the first height and the last height in the Z direction, i.e., the scanning distance, is determined by the potential contaminants. For example, in some embodiments, potential contaminants that may be present on the reticle backside have an average size in a range from about 1 nm to about 100 nm. In such embodiments, the scanning distance is at least about 100 nm from the backside surface of the reticle. In other embodiments, the potential contaminants have an average size in a range from about 10 nm to about 500 nm. In such embodiments, the scanning distance is at least 500 nm from the backside surface of the reticle.

In an embodiment, the process of obtaining the images at different heights is automated by programming a reticle stage controller to move the reticle in predetermined steps beginning at the backside surface of the reticle and stopped when no reflection and/or scattering is detected at the camera. In another embodiment, the process is automated by programming an imaging device to change a plane of focus of the camera in predetermined steps beginning at the backside surface of the reticle and stop when no reflection and/or scattering is detected at the camera. In various embodiments, the predetermined steps change the height at which the image of the reticle is obtained in increments of, for example, about 10 nm, about 50 nm, about 100 nm or about 500 nm (or any other increments between these values), at a time. In other words, planes at which images of the reticle surface are obtained are separated by 10 nm, 50 nm, 100 nm, 500 nm, etc., depending on the increment by which the height is changed.

At S604, the plurality of images is combined to obtain a surface profile map, e.g., 650, of the reticle. Such a surface profile map provides information relating to the size, shape and position (i.e., location) of the contaminant particle 690 resting on the backside surface of the reticle.

In an embodiment, the surface profile map provides a volume rendering for the reticle surface by combining the 2D images obtained by the imaging device using volume rendering techniques. In an embodiment, each of the 2D images (at different heights of the reticle surface) is preprocessed to determine portions of the image that are of interest (e.g., portions where a contaminant particle is detected. For each image, the x and y coordinates of each pixel in the region of interest are transferred to an empty space, the z coordinate being the height at which the image is obtained. The pixels between slices are the interpolated to obtain a volume contour for the region of interest. In some embodiments, the interpolation is simple linear interpolation based on the numerical values of the coordinates alone. In other embodiments, the characteristics of the individual pixels are used to obtain the interpolation function. For example, in an embodiment, the brightness of the individual pixel and the difference between the brightness of neighboring pixels within each 2D image is used to obtain the interpolation function to join corresponding pixels from different 2D images obtained at different heights.

It will be understood that the techniques described herein are merely some of the techniques that can be used for obtaining surface profile maps using a stack of 2D images. Other techniques for obtaining surface profile maps using stacks of 2D images can be used depending on availability of computational resources and time.

In some embodiments, the information about the contaminant particles provided by the surface profile map 650 is analyzed to determine whether to accept the reticle, repair the reticle, or reject the reticle. For example, in some embodiments, an average roughness of the backside surface of the reticle is determined based on the surface profile map 650. In some embodiments, one or more of the number, size, and area density of particles on the backside surface of the reticle is determined based on the surface profile map 650.

Upon analysis of the surface profile map 650, it is determined whether the reticle is acceptable as is, or whether it needs to be repaired or rejected based on, for example, whether a particular parameter such as surface roughness, particle size, particle density or number of particles is above or below a threshold. For example, in an embodiment, the reticle is rejected if it is determined that the average particle size is more than, for example, 100 nm regardless of number or density of particles. In another embodiment, the reticle is rejected if the surface roughness is more than 50 nm/$\mu m^2$ and if a particle size is greater than, for example, 75 nm. In yet another embodiment, for example, the reticle is rejected if the number of particles is greater than 100 particles/$mm^2$ and an average particle size is greater than 50 nm. In some embodiments, it is determined that the reticle needs to be repaired before further use. In such embodiments, remedial measures such as, for example, ultrasonic cleaning, gas jet cleaning, liquid jet cleaning and/or any combination thereof, of the backside surface of the reticle, are taken before further use of the reticle. In various embodiments, the threshold values of parameters to determine whether the reticle needs to be repaired are in a range between those used for determining whether the reticle is acceptable and those used for determining that the reticle is to be rejected. For example, in an embodiment, a reticle with a surface roughness of 10 nm/$\mu m^2$ or less is acceptable, and a reticle with a surface roughness of 50 nm/$\mu m^2$ or more is rejected. In such embodiments, a reticle with a surface roughness between 10 and 50 nm/$\mu m^2$ would be repaired before further use.

In some embodiments, the determination whether to accept the reticle, repair the reticle, or reject the reticle is automatically made by a controller programmed to make the determination. In certain embodiments, the reticle is used in an extreme ultraviolet lithography (EUVL) system.

Thus, embodiments of the present disclosure provide a more rigorous and exacting inspection of reticles, particularly reticles with very tight tolerances, such as those used in EUVL systems.

The present disclosure is not limited to the inspection of reticles used in EUVL systems. Rather the present disclosure is applicable to inspecting reticles used in a variety of exposure systems including mercury lamps, and KrF and ArF lasers.

It will be understood that not all advantages have been necessarily discussed herein, no particular advantage is required for all embodiments or examples, and other embodiments or examples may offer different advantages.

According to one aspect of the present disclosure, a method of inspecting a reticle includes obtaining a first image of a surface of the reticle at a first height by scanning the reticle surface with a light source at the first height of the reticle surface relative to a reference surface height of the reticle surface and obtaining a second image of the reticle surface at a second height by scanning the reticle surface with the light source at the second height of the reticle surface relative to the reference surface height of the reticle surface are obtained. The second height is different from the first height. The distance between the first height and the second height is smaller than a thickness of the reticle. The first and second images are combined to obtain a surface profile image of the reticle. In some embodiments, the method further includes analyzing the surface profile image to determine whether to accept the reticle, repair the reticle, or reject the reticle. In some embodiments, the determination whether to accept the reticle, repair the reticle, or reject the reticle is automatically made by a controller programmed to make the determination. In some embodiments, following a determination to accept the reticle, the reticle is used for patterning a wafer in a lithography process. In some embodiments, following a determination to repair the reticle, the surface of the reticle is cleaned using a process selected from the group consisting of ultrasound cleaning, gas jet cleaning, liquid jet cleaning or a combination thereof. In some embodiments, the method further includes, prior to obtaining the first image of the surface of the reticle, patterning a front surface of the reticle, the front surface being opposite the surface of which the first image is obtained. In some embodiments, the reticle is a reflective reticle. In some embodiments, the scanning of the reticle surface is repeated by moving the reticle in a direction perpendicular to the reticle surface by prescribed increments and scanning the reticle surface at each increment. In some embodiments, a plurality of images, including the first image and the second image, is obtained by detecting light reflected and/or scattered by the reticle surface at the plurality of different height, including the first height and the second height, by an imaging device. In some embodiments, the scanning of the reticle surface is repeated by moving a plane of focus of an imaging device used to detect light reflected and/or scattered by the reticle surface by prescribed increments and capturing the light reflected and/or scattered by the reticle surface at each increment.

According to another aspect of the present disclosure, a reticle inspection system includes a reticle stage on which a reticle to be scanned is located, a scanning light source to direct radiation at the reticle, and a light detector to detect radiation reflected and/or scattered from a surface of the reticle. The system includes a controller programmed to control the reticle inspection system to repeat scanning of the surface of the reticle a plurality of times at a plurality of different heights to obtain a plurality of images. A processor is included in the system, and is programmed to combine the plurality of images to obtain a surface profile image of the reticle, and analyze the surface profile image to determine whether to accept the reticle, repair the reticle, or reject the reticle. In some embodiments, the light detector includes a camera and a set of lenses and/or prisms. In some embodiments, obtaining a plurality of images includes detecting light reflected and/or scattered by the reticle surface at each of the plurality of different heights. In some embodiments, the scanning light source includes a laser. In some embodiments, the determination of whether to accept the reticle, repair the reticle, or reject the reticle is based on whether a contaminant particle is detected upon analysis of the surface profile image, and if detected, whether a size of the contaminant particle exceeds a threshold.

According to yet another aspect of the present disclosure, an apparatus for obtaining a surface profile map of a reticle surface includes a scanner including a light source and a beam steering mechanism configured to scan light provided by the light source across the reticle surface at a prescribed height of the reticle surface and an imaging device configured to detect light reflected and/or scattered by the reticle surface. The apparatus includes a controller programmed to cause the imaging device to obtain a plurality of images of the reticle surface at a plurality of heights, and a processor programmed to obtain the surface profile map of the reticle surface by combining the plurality of images of the reticle surface at the plurality of heights. In some embodiments, the beam steering mechanism includes a mirror. In some embodiments, causing the imaging device to obtain a plurality of images includes moving the reticle in a direction perpendicular to the reticle surface by prescribed increments and scanning the reticle surface at each increment. In some embodiments, the causing the imaging device to obtain a plurality of images includes moving a plane of focus of the light detector by prescribed increments and detecting the light reflected and/or scattered by the reticle surface at each of the prescribed increments. In some embodiments, the processor is programmed to analyze the surface profile map to determine whether to accept the reticle, repair the reticle, or reject the reticle.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of inspecting a reticle, comprising:
   obtaining a first image of a backside surface of the reticle at a first height by simultaneously rastering lights beams from at least two light sources directly on the backside surface of the reticle at the first height of the backside surface of the reticle relative to a reference surface height of the backside surface of the reticle;
   obtaining a second image of the backside surface of the reticle at a second height by rastering the light beams directly on the backside surface of the reticle at the second height of the backside surface of the reticle relative to the reference surface height of the backside surface of the reticle, wherein the second height is different from the first height, a distance between the first height and the second height is smaller than a thickness of the reticle, and at least two light sources emit light having different wavelengths; and
   combining the first and second images to obtain a surface profile image of the reticle.

2. The method according to claim 1, further comprising analyzing the surface profile image to determine whether to accept the reticle, repair the reticle, or reject the reticle.

3. The method according to claim 2, wherein the determination whether to accept the reticle, repair the reticle, or reject the reticle is made by a controller configured to make the determination.

4. The method according to claim 2, further comprising, following a determination to accept the reticle, using the reticle for patterning a wafer in a lithography process.

5. The method according to claim 2, further comprising, following a determination to repair the reticle, cleaning the backside surface of the reticle using a process selected from the group consisting of ultrasound cleaning, gas jet cleaning, liquid jet cleaning and a combination thereof.

6. The method according to claim 1, further comprising, prior to obtaining the first image of the backside surface of the reticle, patterning a front surface of the reticle, the front surface being opposite the backside surface of which the first image is obtained.

7. The method according to claim 1, further comprising repeating the scanning of the backside surface of the reticle by moving the reticle in a direction perpendicular to the backside surface of the reticle by prescribed increments and scanning the backside surface of the reticle at each increment.

8. The method according to claim 1, further comprising obtaining a plurality of images, including the first image and the second image, by detecting light reflected and/or scattered by the backside surface of the reticle at a plurality of different heights, including the first height and the second height, by an imaging device.

9. The method according to claim 1, further comprising repeating the scanning of the backside surface of the reticle by moving a plane of focus of an imaging device used to detect light reflected and/or scattered by the backside surface of the reticle by prescribed increments and capturing the light reflected and/or scattered by the backside surface of the reticle at each increment.

10. The method according to claim 1, wherein the reticle is arranged in a vacuum housing having a transparent window, and the method further comprises directing the light beams on the backside surface of the reticle through the transparent window.

11. A reticle inspection system, comprising:
   a reticle stage on which a reticle to be scanned is located;
   at least two scanning light sources to direct radiation at the reticle, wherein the at least two scanning light sources simultaneously emit light that is rastered directly on a backside surface of the reticle, and each scanning light source emits light having a different wavelength;
   a light detector to detect radiation reflected and/or scattered from the backside surface of the reticle;
   a controller configured to control the reticle inspection system to repeat scanning of the backside surface of the reticle a plurality of times at a plurality of different heights to obtain a plurality of images; and
   a processor programmed to:

combine the plurality of images to obtain a surface profile image of the reticle, and analyze the surface profile image to determine whether to accept the reticle, repair the reticle, or reject the reticle.

12. The reticle inspection system according to claim 11, wherein the light detector comprises a camera and one or more lenses and/or prisms.

13. The reticle inspection system according to claim 11, wherein obtaining a plurality of images comprises detecting light reflected and/or scattered by the backside reticle at each of the plurality of different heights.

14. The reticle inspection system according to claim 11, wherein the determination of whether to accept the reticle, repair the reticle, or reject the reticle is based on whether a contaminant particle is detected upon analysis of the surface profile image, and if detected, whether a size of the contaminant particle exceeds a threshold.

15. The reticle inspection system according to claim 11, further comprising a vacuum housing having a transparent window and the reticle stage arranged therein, wherein the at least two scanning light sources direct radiation on the backside surface of the reticle through the transparent window.

16. An apparatus for obtaining a surface profile map of a backside surface of a reticle, the apparatus comprising:

a scanner having at least two light sources and a beam steering mechanism configured to simultaneously raster light beams provided by the at least two light sources directly across the backside surface of the reticle at a prescribed height of the backside surface of the reticle, wherein the light sources emit light having different wavelengths;

an imaging device configured to detect light reflected and/or scattered by the backside surface of the reticle;

a controller configured to cause the imaging device to obtain a plurality of images of the backside surface of the reticle at a plurality of heights; and a processor configured to obtain the surface profile map of the backside surface of the reticle by combining the plurality of images of the backside surface of the reticle at the plurality of heights.

17. The apparatus according to claim 16, wherein causing the imaging device to obtain a plurality of images comprises moving the reticle in a direction perpendicular to the backside surface of the reticle by prescribed increments and scanning the backside surface of the reticle at each increment.

18. The apparatus according to claim 16, wherein causing the imaging device to obtain a plurality of images comprises moving a plane of focus of the light detector by prescribed increments and detecting the light reflected and/or scattered by the backside surface of the reticle at each of the prescribed increments.

19. The apparatus according to claim 16, wherein the processor is further configured to analyze the surface profile map to determine whether to accept the reticle, repair the reticle, or reject the reticle.

20. The apparatus according to claim 16, wherein the controller is configured to calculate a distance between a first height and a last height of the plurality of heights based on a size of a potential contaminant particle present on the backside surface of the reticle.

* * * * *